United States Patent
Shih et al.

(10) Patent No.: US 10,847,490 B2
(45) Date of Patent: Nov. 24, 2020

(54) BONDING ALIGNMENT TOOL

(71) Applicant: TAIWAN SEMICONDUCTOR MANUFACTURING COMPANY, LTD., Hsinchu (TW)

(72) Inventors: Yun-Tai Shih, Lugang Township (TW); Kuan-Ming Pan, Hsinchu (TW); Jeng-Hao Lin, Chubei (TW); I-Shi Wang, Sanxia Township (TW); Jui-Mu Cho, Chupei (TW); Ching-Hou Su, Hsinchu (TW); Chyi-Tsong Ni, Hsinchu (TW); Wun-Kai Tsai, Huwei Township (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 16/546,861

(22) Filed: Aug. 21, 2019

(65) Prior Publication Data
US 2019/0378813 A1 Dec. 12, 2019

Related U.S. Application Data

(62) Division of application No. 14/819,552, filed on Aug. 6, 2015, now Pat. No. 10,396,054, which is a division
(Continued)

(51) Int. Cl.
*H01L 23/00* (2006.01)
*H01L 23/544* (2006.01)
(Continued)

(52) U.S. Cl.
CPC ........ *H01L 24/75* (2013.01); *H01L 21/67092* (2013.01); *H01L 21/681* (2013.01); *H01L 23/544* (2013.01); *H01L 21/68* (2013.01); *H01L 21/682* (2013.01); *H01L 2223/54426* (2013.01); *H01L 2224/75703* (2013.01); *H01L 2224/75753* (2013.01); *H01L 2224/75901* (2013.01); *Y10T 29/49* (2015.01); *Y10T 29/49002* (2015.01); *Y10T 29/49131* (2015.01); *Y10T 29/49764* (2015.01); *Y10T 29/53022* (2015.01)

(58) Field of Classification Search
USPC .......................................... 29/739, 729, 700
See application file for complete search history.

(56) References Cited

U.S. PATENT DOCUMENTS

| | | | |
|---|---|---|---|
| 5,855,637 | A | 1/1999 | Yakou et al. |
| 6,008,113 | A | 12/1999 | Ismail et al. |

(Continued)

*Primary Examiner* — Peter Dungba Vo
*Assistant Examiner* — Azm A Parvez
(74) *Attorney, Agent, or Firm* — Hauptman Ham, LLP

(57) ABSTRACT

An apparatus includes an alignment module configured to align a first wafer and a second wafer based on alignment markers on the first wafer and corresponding alignment markers on the second wafer. The apparatus further includes a flag placement module configured to insert a plurality of flags between the first wafer and the second wafer, a flag-out mechanism configured to simultaneously move the plurality of flags to a flag-out position, and a controller configured to determine whether the wafers remain aligned within an alignment tolerance based on an amount of time for each flag of the plurality of flags to reach the flag-out position.

20 Claims, 7 Drawing Sheets

Related U.S. Application Data of application No. 13/267,336, filed on Oct. 6, 2011, now Pat. No. 9,123,754.

(51) Int. Cl.
  *H01L 21/68* (2006.01)
  *H01L 21/67* (2006.01)

(56) References Cited

U.S. PATENT DOCUMENTS

| | | |
|---|---|---|
| 7,682,933 B1 * | 3/2010 | Loomis ............... H01L 25/50 |
| | | 257/E21.122 |
| 8,147,630 B2 | 4/2012 | George |
| 2003/0092244 A1 | 5/2003 | Oi et al. |
| 2005/0181579 A1 | 8/2005 | Thallner |
| 2007/0249098 A1 | 10/2007 | Cady et al. |
| 2008/0164606 A1 | 7/2008 | Greisen et al. |
| 2009/0251699 A1 | 10/2009 | George |
| 2010/0047052 A1 | 2/2010 | Burke et al. |
| 2010/0071847 A1 | 3/2010 | Shin et al. |
| 2011/0013865 A1 | 1/2011 | Shibata et al. |
| 2012/0021140 A1 * | 1/2012 | Dijksman ............. B82Y 10/00 |
| | | 427/595 |
| 2012/0186741 A1 | 7/2012 | Lake |
| 2014/0319786 A1 | 10/2014 | Johnson et al. |

\* cited by examiner (1)

BONDING ALIGNMENT TOOL

PRIORITY CLAIM

The present application is a divisional of U.S. application Ser. No. 14/819,552, filed Aug. 6, 2015, which is a divisional of U.S. application Ser. No. 13/267,336, filed Oct. 6, 2011, now U.S. Pat. No. 9,123,754, issued Sep. 1, 2015, which are incorporated herein by reference in their entireties.

BACKGROUND

A number of semiconductor technologies involve aligning two or more wafers and thereafter bonding the wafers. Consider, e.g., the use of eutectic bonding, which applies heat and pressure to connect two or more aligned semiconductor wafers. A sufficient alignment is one in which the features from one wafer are properly aligned to corresponding features on a second wafer. Here, alignment tolerances (the dividing line between sufficient and insufficient alignments) are roughly proportional to the sizes of the features on the wafers. One method of alignment involves the use of two or more "flags," which are markers placed between wafers. After a sufficient alignment is achieved, the flags are removed by a flag-out mechanism, such as a gas-operated mechanism (e.g., using air, $N_2$, etc.) or an electromagnetic mechanism. Removing the flags, however, can result in an insufficient alignment of the wafers, which could cause the entire process to result in unsatisfactory bonding of the wafers.

To minimize unsatisfactory bonding, operators take certain precautions to monitor removal of the flags to ensure that sufficient alignment is maintained. In one approach known to the inventors, an operator visually inspects the alignment to ensure a sufficient alignment is maintained during removing the flags. The operator watches each of the flag-out movements in the mechanism during the removal process and perceptible differences in flag velocity would indicate a misalignment of the wafers. After noticing an insufficient alignment, the operator could respond, e.g., by adjusting the apparatus (e.g., adjusting the gas pressure in a gas-operated mechanism) in order to modify the flag-out procedure based on the perceived differences in flag velocity. However, this method merely makes it possible to achieve a perceptible level of alignment precision. If the differences in each flag's velocity are imperceptible to the operator, not only could a latent, imprecise alignment result, but thereafter bonding the imprecisely aligned wafers would yield an unsatisfactorily bonded set of wafers, which would tend to be scrapped. In other words, an operator's limits of perception can adversely affect a scrap rate (i.e., percentage of unsatisfactorily bonded wafers) of a production and the size of the features on the wafers of a production.

BRIEF DESCRIPTION OF THE DRAWINGS

One or more embodiments are illustrated by way of example, and not by limitation, in the figures of the accompanying drawings, wherein, where ever possible, elements having the same reference numeral designations represent like elements throughout. The accompanying drawings are incorporated herein and are part of this disclosure. The accompanying drawings help explain the principles herein apparent.

DETAILED DESCRIPTION

Figure 1:
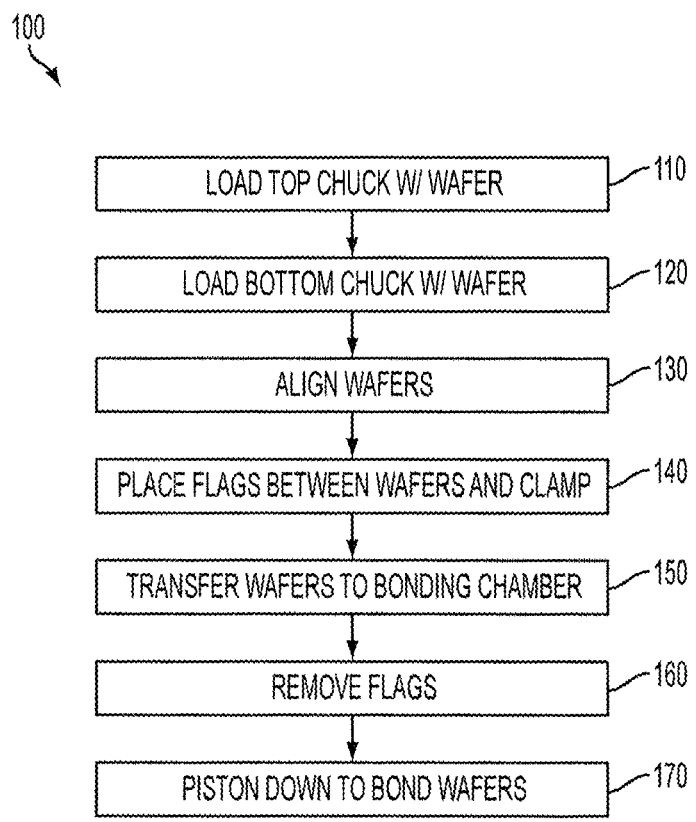
FIG. 1 is a flowchart of a method of aligning two wafers according to some embodiments.

The following disclosure provides many different embodiments, or examples, for implementing different features described below. Specific examples of components and arrangements are described below to simplify the present disclosure. These are, of course, merely examples and are not intended to be limiting. For example, various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed.

Although suitable for different uses, the apparatus and method herein are described with reference to a bonding process. One of ordinary skill would be able to apply the disclosure to technologies involving aligning two or more wafers and optionally thereafter bonding the wafers.

In a bonding process, the process has at least two steps—an alignment phase of aligning two or more wafers to be bonded, and a "piston down" phase of actually heating and pressing the wafers together to complete the bond. FIG. 1 is a flowchart of a method 100 of bonding a wafer in which, according to at least some embodiments, the alignment phase has several steps before execution of the piston down phase for wafer bonding. The bonding process will be described in further detail below, along with a depiction of the process in FIGS. 2A-2E. The alignment and bonding below is described with reference to two wafers for convenience. The alignment can be modified or adapted to apply to more than two wafers. For example, in some embodiments three or four wafers are aligned.

At a step 110, a top plate, or chuck, in an alignment module is loaded with a wafer. Depicted in FIG. 2A, a top plate 210 holds a first wafer 220 with a mechanism such as a vacuum/suction, in order to move wafer 220 into place. At a step 120 and depicted in FIG. 2B, a bottom plate 230 is loaded with a second wafer 240. In some embodiments, the bottom plate 230 holds second wafer 240 in place with a mechanism such as a vacuum/suction mechanism in much the same manner top plate 210 holds wafer 220.

Figure 2A:
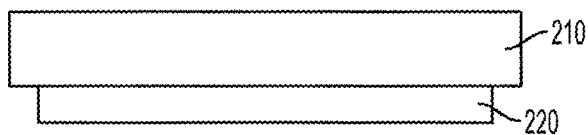
FIGS. 2A-2E show a process of aligning two wafers according to the method of FIG. 1.
Figure 2B:
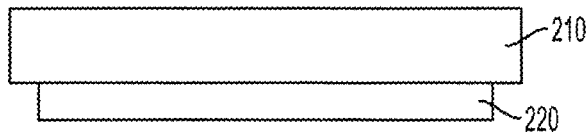
Figure 2B:
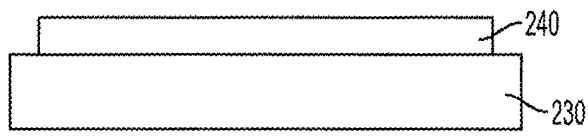
Figure 2C:
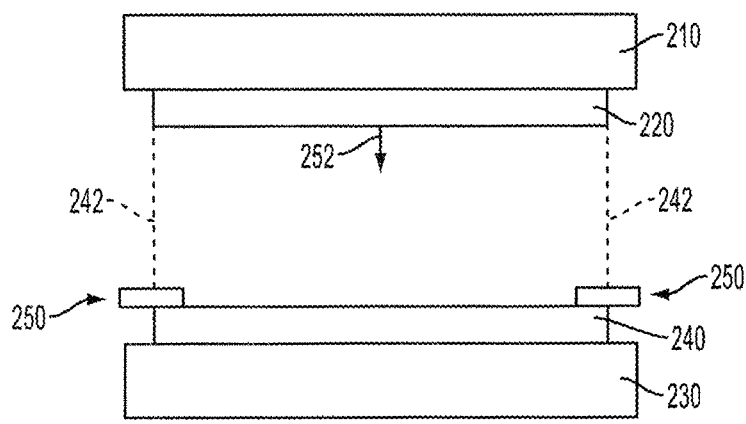
Figure 2D:
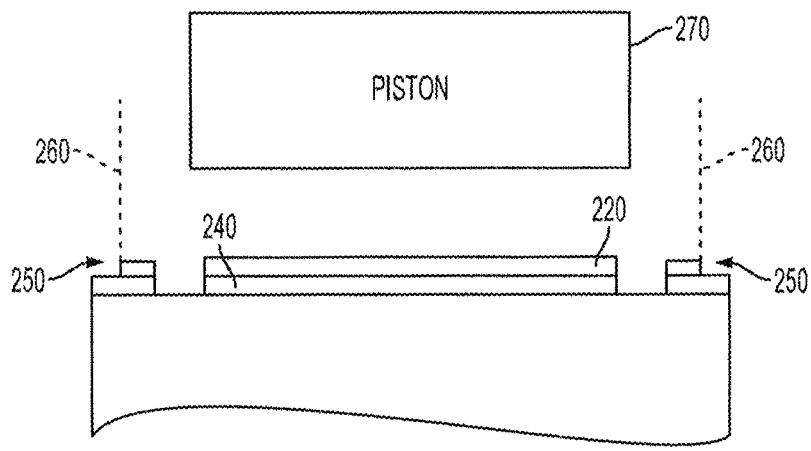
Figure 2E:
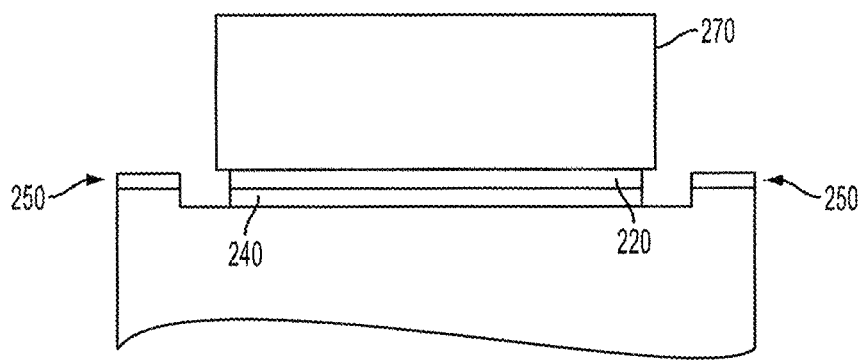

At a step 130 and as shown in FIG. 2C, wafers 220 and 240 are aligned as shown by dashed lines 242. In some embodiments, bonding is achieved by aligning first wafer 220 and second wafer 240 so that a film of pure metal located on wafer 220 contacts a film of an alloy on wafer 240. In alternative embodiments, multiple contact sites are utilized to make multiple bonds, and as a result, aligning multiple contact sites or bonding sites becomes more exacting.

At a step 140, "flags," i.e., markers or spacer elements, are put in place between the wafers and the wafers are clamped holding the flags as depicted in FIG. 2C. During the alignment, a set (e.g., 2, 3, 4, 5, etc.) of flags 250 are used to align wafers that are to be bonded. Then wafer 220 is clamped to wafer 240, shown with a downward arrow 252 in FIG. 2C. Flags 250 are thus clamped between wafers 220 and 240.

In some embodiments of bonding, the alignment is precise, such as for wafers involving micro-electro-mechanical system (MEMS) devices and, as such, the bonded wafers cannot operate properly outside tolerances. In some embodiments, the tolerances are less than 5 µm or 2.5 µm to 10 µm. Thus, the alignment with flags 250 facilitates the degree of precision depending on the specifications of the wafers to be bonded.

At a step 150 (not shown in FIGS. 2A-2E), the wafers are transferred to a bonding chamber. At a step 160, and depicted in FIG. 2D, the flags are then simultaneously removed by a flag-out mechanism and are subsequently placed in a flag-out position 260. In some embodiments, removal is by a gas-operated mechanism. In alternative embodiments, the flag-out step 160 is by an electromagnetic mechanism. At a step 170 and shown in FIG. 2E, a piston 270 presses the wafers together during a piston down process, which bonds wafers 220 and 240.

When flags 250 are removed at the same time and with the same velocity, wafers 220 and 240 remain in alignment and, following the piston down phase in step 170, bonds are formed in the proper places between the two wafers. However, when one or more of flags 250 are removed at different velocities, wafers 220 and 240 are pulled in directions that misalign the wafers. In some embodiments of bonding, this misalignment results in unsatisfactory wafer bonding. Because systems known to the inventors rely on an operator's perception, using some embodiments of the apparatus and method of the present disclosure makes it possible to achieve alignments having tolerances less than 5 µm and not only a greater degree of certainty or precision in flag-out timing but also a lower scrap rate of bonded wafers.

Figure 3:
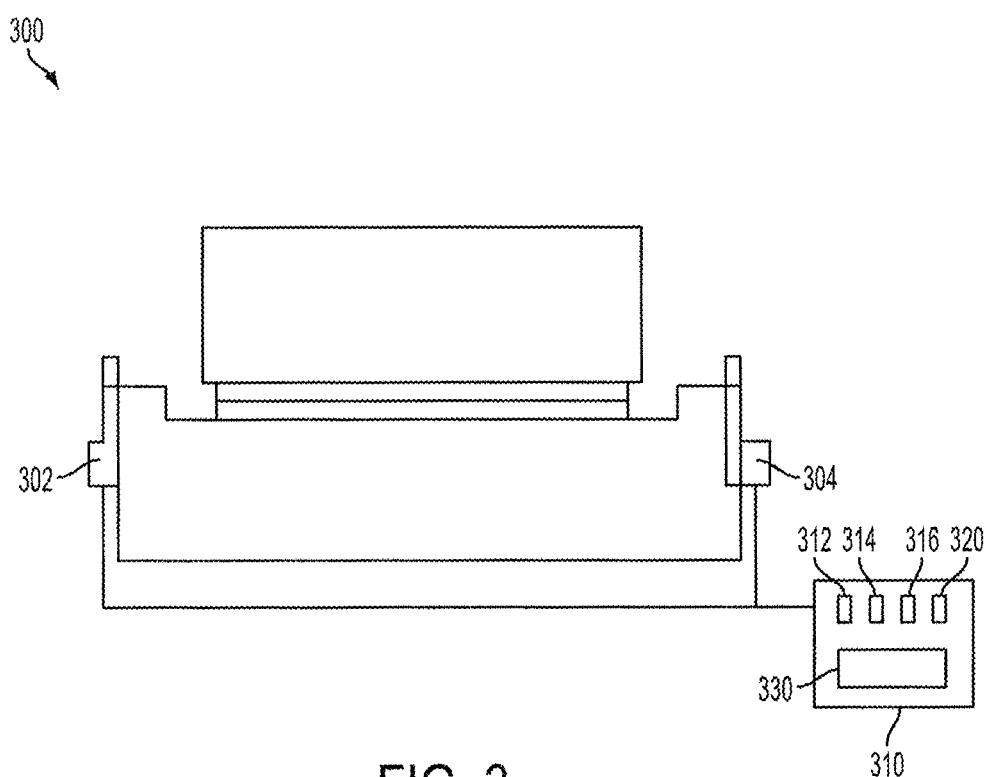
FIG. 3 is a simplified diagram of an apparatus for detecting flag velocity according to some embodiments of the present disclosure.

FIG. 3 is a simplified diagram of an apparatus 300 for detecting flag velocity during a process for bonding two wafers according to some embodiments of the present disclosure. Sensors 302 and 304 are shown and are configured to measure the timing and/or velocity of the flags during the flag-out process. Each sensor 302 and 304 is attached to the bonding apparatus 300 at the point a flag reaches the flag-out position in the flag-out mechanism. Shown in a top-level diagram of FIG. 4, but hidden in FIG. 3, is a third sensor 306, which is attached at the third flag-out mechanism. Sensors 302-306 are photoelectric sensors for detecting when the flag reaches a flag-out position, e.g., positions 260.

While photoelectric sensors are shown, some embodiments use different types of sensors. For example, limit switches, magnetic cylinder switches, electro-mechanical switches, linear variable differential transformer (LVDT) sensors, or other suitable sensors are possible.

Sensors 302-306 are coupled with a control and display module 310, which includes controllers 312, 314, and 316, along with a timer 320, and a display 330. Sensors 302-306 are coupled with controllers 312-316 in order to detect flag velocity and provide feedback for alignment. Controller 312 is an integrated circuit which is configured to receive a first input signal from sensor 302. In conjunction with timer 320, controller 312 calculates the flag-out velocity in order to ensure proper alignment. For instance, controller 312 calculates/determines an elapsed time based on input from timer 320 after the flag-out mechanism is triggered for flag 250 to reach a flag-out position 260 (i.e., trips sensor 302) located a certain distance away from flag 250's starting point. The controller 312 then generates a time value, which is driven to a display 330 and is shown as an elapsed time on the display. Likewise, controllers 314 and 316 receive input signals and calculate the time for the other two flags to reach their respective flag-out positions. Thus, an elapsed time is shown for each flag with precision, e.g., to within ¹⁄₁₀₀th of a second or better.

While the embodiment shown in FIG. 3 depicts a time measurement, the scope of the present disclosure is not so limited. In other embodiments, controllers 312-316 can calculate a flag-out velocity with use of the distance and time needed for each flag to reach a flag-out position. For example, in some embodiments velocity is calculated and is caused to be displayed on display 330 in millimeters per second. Alternatively, controller 312 receives input signals from sensors 302 and 304, along with timing signals from timer 320. Processing the signals received from each component, controller 312 calculates the differential in time between a first flag and a second flag (i.e., the last flag) reaching the flag-out position. For example, processor 312 can calculate the difference in time between when two of flags 250 reach their respective flag-out positions.

In alternative embodiments, controllers 312 and 314 each calculate a differential time for a three-flag system (i.e., differential between a first and a second flag reaching their respective flag-out positions, and a difference between the second flag and a third flag, the last flag reaching the flag-out position). In still further embodiments, controllers 312-316 calculate three differentials, such that the difference in flag-out velocity between all three flags is displayed. In another alternative embodiment, controller 312 is configured to calculate a time differential on all three sensors (e.g., receive all three inputs and calculate the difference between the time the first input signal is received and the time the third input signal is received). In yet further embodiments, controllers 312-316 are replaced by a single processor, configured to receive any number of input signals necessary, calculate elapsed times and differentials, and perform other calculations with respect to the input signals received from sensors 302-306.

In yet further embodiments, other sensors are used and/or different types of calculations are made. In some embodiments, timer 320 is used in conjunction with a voltage or current reading from alternative sensors 302-306. Therefore, conversion from a voltage or current value to a calculated flag-out time or a flag-out time differential is performed. In still further embodiments, a voltage or a current reading is displayed in much the same manner that a flag-out time reading is displayed, without any differential calculation. Thus, an operator monitors an actual voltage or current reading in order to determine if each flag reaches flag-out without causing misalignment (i.e., within a certain voltage or current threshold). One of ordinary skill in the art will appreciate that a number of other alternative embodiments are possible.

In FIG. 3, controller 312 is a three-pin integrated circuit that receives a positive voltage power signal, a ground signal, and an input signal from sensor 302. Controller 312 combines the input signal received from sensor 302 with timing information from timer 320 to cause display 330 to display a flag-out time. Controllers 314 and 316 are configured similarly with respect to sensors 304 and 306. Thus, all three flag-out velocitys are optionally determined and/or displayed.

Figure 5:
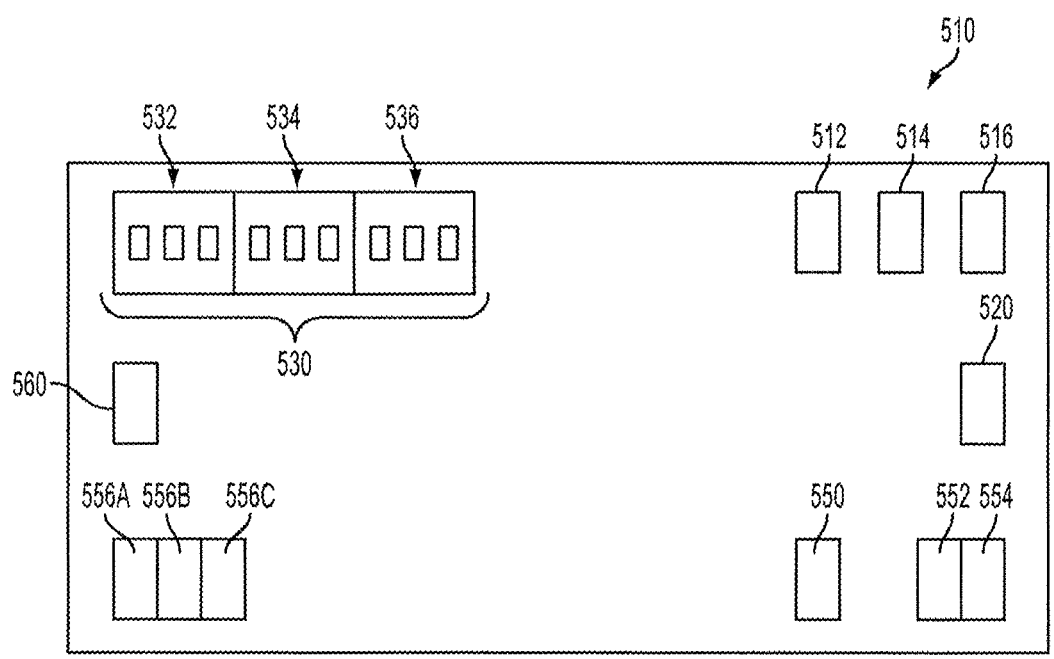
FIG. 5 is a schematic of a display and signal apparatus according to some embodiments.

FIG. 5 is a schematic of a control and display module 510 (formerly 310) according to some embodiments. A number of features of control and display module 510 are not numbered nor described so as not to obscure the present disclosure. Control and display module 510 includes three time displays 532, 534, and 536. As described above with regard to apparatus 300, displays 532-536 display the flag-out time of three flags. Displays 532-536 show the time for each flag to reach a respective flag-out position, e.g., within $\frac{1}{100}^{th}$ of one second or better. In alternative embodiments, a different level of precision may be used. In yet other embodiments, the display is based on a differential time to a specified level of precision. In yet further embodiments, displays 532-536 do not display times at all, but different values, such as velocities, voltages, currents, or other values are displayed.

In other embodiments, values are not displayed at all. Instead, a predetermined threshold is established and displays 532-536 display whether the flag process remains within that threshold. As an example, an upper limit is established at which scrap rate is affected, e.g., an elapsed time of less than 0.05 seconds for a flag to reach the flag out position from when the flag-out mechanism is triggered. Displays 532-536 display an indication as to whether or not the predetermined threshold is maintained. For instance, a green light indicates elapsed times under 0.05 seconds, while a red light indicates times over 0.05 seconds (and perhaps an adjustment by an operator).

Control and display module 510 also includes a tool signal 550, a positive voltage 552, a ground signal 554, three flag voltage signals 556A-556C, and a bypass control 560. Positive voltage 552 and ground signal 554 allow for control and display module 510 to be powered. Tool signal 550 electrically couples control and display module 510 to the eutectic bonding apparatus that is being monitored, such that if the eutectic bonding apparatus is not powered then the control and display module is not operational. Voltage signals 556A-556C ensure that the proper voltage is supplied to the respective flag-out mechanisms. Finally, bypass control 560 allows an operator to operate the bonding apparatus independent of control and display module 510 if necessary for some reason by bypassing module 510 altogether.

Figure 4:
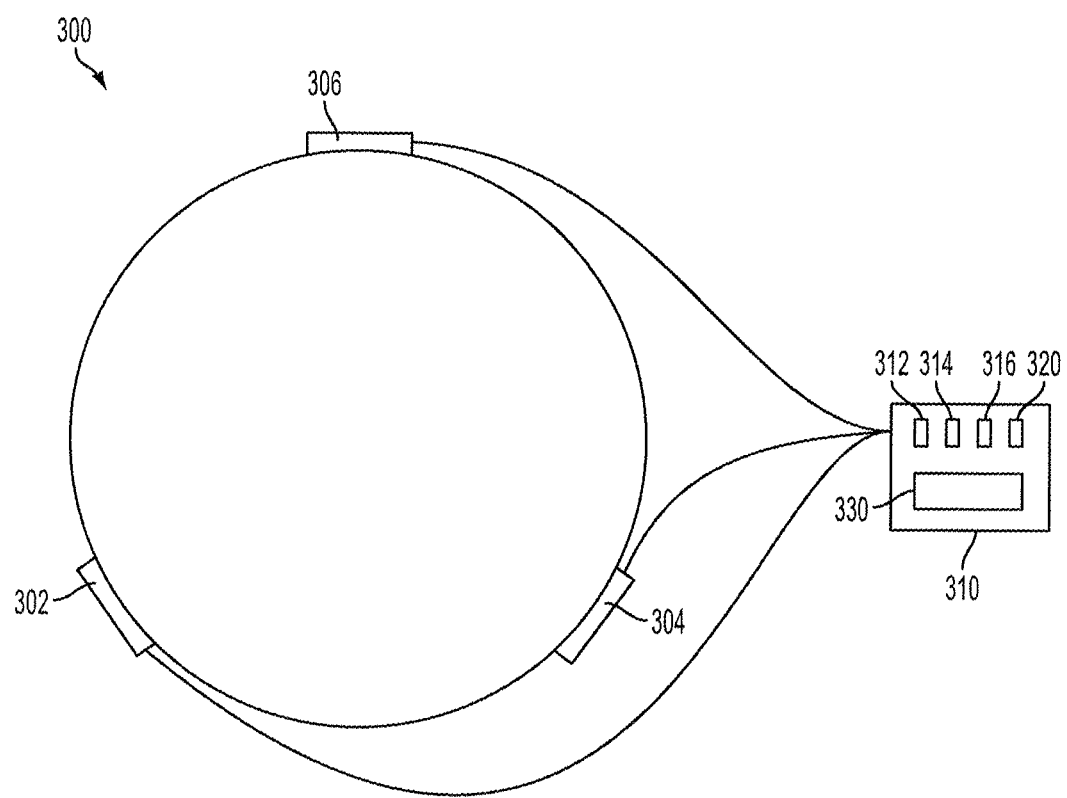
FIG. 4 is a top-view diagram of the FIG. 3 apparatus according to some embodiments.
Figure 6:
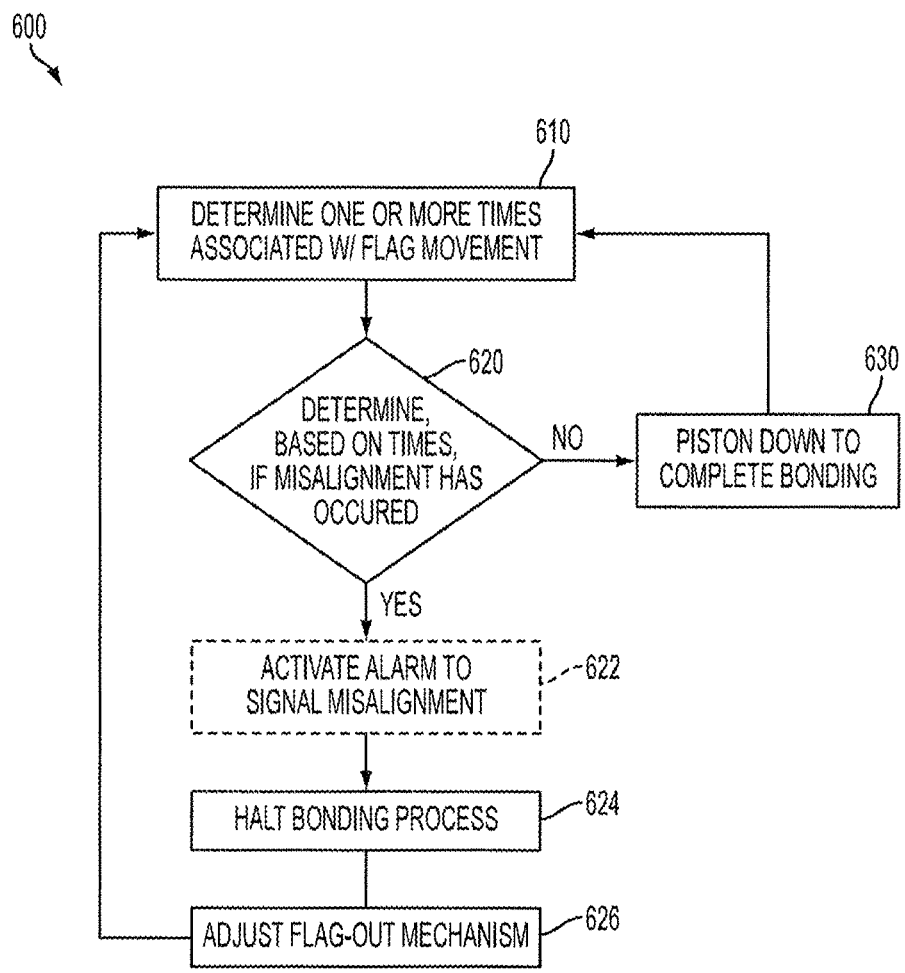
FIG. 6 is a flowchart of a method of aligning wafers in a bonding process according to some embodiments.

FIG. 6 is a flowchart of a method 600 of aligning wafers in a eutectic bonding process according to an embodiment. A plurality of flag-out sensors for detecting movement of a plurality of flags in a flag-out mechanism is provided. For example, three photo-electric flag-out sensors are used in an apparatus as depicted in FIGS. 3-5. In the depicted embodiments, three flags are monitored. In alternative embodiments, more flags or fewer flags are used. In other alternative embodiments, different types of sensors are provided, as described above (e.g., limit switches, magnetic cylinder switches, electro-mechanical switches, linear variable differential transformer (LVDT) sensors, or other suitable sensors).

In some embodiments, a plurality of time displays is also provided. At a step 610, one or more durations of time associated with the movement of the flags in the plurality of flags are determined. As an example, time displays 532-536 as described with regard to FIG. 5 are provided. A display shows the elapsed time for a flag to reach a flag-out position, e.g., as calculated using sensor 302, controller 312, and timer 320 displaying a result on display 532. Displays 534 and 536 also display elapsed times based on sensors 304/306, controller 314/316, and timer 320.

The method continues at a step 620, when a determination as to whether or not misalignment has occurred is made based on the one or more durations of time associated with the movement of the flags. For instance, in the embodiment depicted in FIGS. 3-5, misalignment is determined to have occurred if displays 532-536 indicate a difference in flag-out time greater than a threshold, such as 0.05 seconds. In some embodiments, the threshold varies due to velocity, distance traveled, etc. of the flags being sensed. In other embodiments, a differential timing method is used, and therefore determination is made with regard to a threshold value (e.g., 0.1, 0.05, or 0.01 seconds). In still other embodiments, determination is made by a velocity measurement, a differential velocity measurement, a voltage measurement, a differential voltage measurement, a current measurement, a differential current measurement, or other suitable measurement.

If no misalignment occurs, the piston down process takes place and the wafers are bonded at a step 630. If a misalignment occurs, method 600 can continue with an optional step 622 of activating an alarm. For instance, an alarm can be sounded if the elapsed time difference is greater than 0.05 seconds for any of the flags being monitored or a differential exceeds a predetermined value. In the depicted embodiments, an auditory alarm (e.g., a buzzer or a tone) is sounded. In other embodiments a visual alarm is activated, such as a flashing display light or icon. In yet further embodiments, both visual and audio alarms signal misalignment.

An additional step 624 halts the eutectic bonding process if a misalignment has occurred (or if an alarm is activated in the optional step 622). For instance, if an alarm is sounded at step 622, the bonding process is halted at step 624 until either an adjustment is made in the flag-out mechanism in a step 626, the alarm is cleared, e.g., by an operator, or the bypass control 560 is actuated. If the adjustment is made at step 626, the method 600 returns to step 610 to determine flag-out timing.

Aspects of the present disclosure relate to an apparatus which includes an alignment module configured to align a first wafer and a second wafer based on alignment markings on the first wafer and corresponding alignment markings on the second wafer, a flag placement module configured to insert a plurality of flags between the first wafer and the second wafer, a flag-out mechanism configured to simultaneously move the flags of the plurality of flags to a flag-out position, and a controller configured to determine whether the wafers remain aligned within an alignment tolerance based on an amount of time for each flag of the plurality of flags to reach the flag-out position. In some embodiments, the flag placement module further includes one or more of a gas-operated mechanism configured to place the flags of the plurality of flags between the first wafer and the second wafer. In some embodiments, the flag-out mechanism further includes an electro-mechanical mechanism configured to remove the flags of the plurality of flags from between the first wafer and the second wafer. In some embodiments, the flag-out mechanism further comprises sensors configured to detect the flags of the plurality of flags. In some embodiments, at least one of the sensors is a limit switch, a magnetic cylinder sensor, a photoelectric sensor, an electro-mechanical switch, or a linear variable differential transformer (LVDT). In some embodiments, the controller further comprises at least one processor configured to generate a misalignment indicator based on a determination that one of the first wafer and the second wafer is out of alignment by more than a predetermined threshold following removal of the flags of the plurality of flags. In some embodiments, the misalignment indicator generated by the at least one processor comprises at least one of an audible alarm or a visual alarm. In some embodiments, the controller is configured to stop a process of alignment of the first wafer and the second wafer based on the misalignment indicator. In some embodiments, the controller is configured to generate a misalignment indicator based on a determination that a flag removal velocity for a first flag of the plurality is different from a flag removal velocity for a second flag of the plurality of flags by a predetermined velocity threshold.

Aspects of the present disclosure relate to an apparatus which includes a flag-out mechanism configured to remove a plurality of markers from an area between at least two wafers, and at least one processor configured to calculate a velocity by which each of the markers is removed, and to generate an indicator of misalignment of the at least two wafers based on the calculated velocity of each marker, wherein the processor is configured to determine the wafers are misaligned based on a difference between the velocities by which each marker of the plurality of markers is removed. In some embodiments, the apparatus further includes sensors configured to detect data related to a flag-out condition of the plurality of flags, and at least one processor configured to receive data from the sensors, to calculate at least one value related to flag-out timing, and to drive a display indicating an alignment status of the at least two wafers. In some embodiments, the processor is configured to trigger an audible alert indicating the flag-out condition of the plurality of flags. In some embodiments, at least one of the sensors is a limit switch, a magnetic cylinder sensor, a photoelectric sensor, an electro-mechanical switch, or a linear variable differential transformer (LVDT). In some embodiments, the flag placement module further includes a gas-operated mechanism configured to place the markers of the plurality of markets between the at least two wafers. In some embodiments, the flag-out mechanism further includes an electro-mechanical mechanism configured to remove the markers of the plurality of markets from between the at least two wafers.

Aspects of the present disclosure relate to an apparatus which includes a flag-out mechanism configured to remove a plurality of markers from an area between at least two wafers, and at least one processor configured to calculate a velocity by which each of the markers is removed, and to generate an indicator of misalignment of the at least two wafers based on the calculated velocity, wherein the processor is configured to determine the wafers are misaligned based on a difference between the velocities by which the each marker of the plurality of markers is removed. In some embodiments, the flag-out mechanism is configured to simultaneously remove the markers of the plurality of markers. In some embodiments, removal of the markers comprises moving the markers of the plurality of markers from a starting position to a corresponding flag-out position for each marker of the plurality of markers, wherein the velocity by which each of the markers of the plurality of markers is removed is based on a distance between the starting position and the flag-out position for each marker of the plurality of markers, and a duration of time for each marker of the plurality of markers to reach the flag-out position. In some embodiments, the apparatus further includes one or more of a limit switch, a magnetic cylinder sensor, a photoelectric sensor, an electro-mechanical switch, or a linear variable differential transformer (LVDT) sensor communicatively coupled with the at least one processor, the at least one processor being configured to determine the velocity by which each of the markers is removed based on feedback received from the limit switch, the magnetic cylinder sensor, the photoelectric sensor, the electro-mechanical switch, or the linear variable differential transformer (LVDT) sensor. In some embodiments, the processor is configured to generate a display indicating the wafers are substantially aligned based on the difference between the velocities by which the each of the markers is removed being less than a predetermined threshold.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An apparatus, comprising:
an alignment module configured to align a first wafer and a second wafer based on alignment markings on the first wafer and corresponding alignment markings on the second wafer;
a flag placement module configured to insert a plurality of flags between the first wafer and the second wafer;
a flag-out mechanism configured to use sensors to detect the flags of the plurality of flags and to simultaneously move the flags of the plurality of flags to a flag-out position; and
a controller configured to determine whether the wafers remain aligned within an alignment tolerance based on an amount of time for each flag of the plurality of flags to reach the flag-out position.

2. The apparatus of claim 1, wherein the flag placement module further comprises a gas-operated mechanism configured to place the flags of the plurality of flags between the first wafer and the second wafer.

3. The apparatus of claim 1, wherein the flag-out mechanism further comprises an electro-mechanical mechanism configured to remove the flags of the plurality of flags from between the first wafer and the second wafer.

4. The apparatus of claim 1, wherein at least one of the sensors is a limit switch, a magnetic cylinder sensor, a photoelectric sensor, an electro-mechanical switch, or a linear variable differential transformer (LVDT).

5. The apparatus of claim 1, wherein the controller further comprises at least one processor configured to generate a misalignment indicator based on a determination that one of the first wafer and the second wafer is out of alignment by more than a predetermined threshold following removal of the flags of the plurality of flags.

6. The apparatus of claim 5, wherein the misalignment indicator generated by the at least one processor comprises at least one of an audible alarm or a visual alarm.

7. The apparatus of claim 5, wherein the controller is configured to stop a process of alignment of the first wafer and the second wafer based on the misalignment indicator.

8. The apparatus of claim 5, wherein the controller is configured to generate a misalignment indicator based on a determination that a flag removal velocity for a first flag of the plurality is different from a flag removal velocity for a second flag of the plurality of flags by a predetermined velocity threshold.

9. An apparatus, comprising:
a flag-out mechanism configured to remove a plurality of markers from an area between at least two wafers; and
at least one processor configured to calculate a velocity by which each of the markers is removed, and to generate an indicator of misalignment of the at least two wafers based on the calculated velocity of each marker, wherein the processor is configured to determine the wafers are misaligned based on a difference between the velocities by which each marker of the plurality of markers is removed.

10. The apparatus of claim 9, further comprising sensors configured to detect data related to a flag-out condition of the plurality of markers, and at least one processor configured to receive data from the sensors, to calculate at least one value related to flag-out timing, and to drive a display indicating an alignment status of the at least two wafers.

11. The apparatus of claim 10, wherein the processor is configured to trigger an audible alert indicating the flag-out condition of the plurality of markers.

12. The apparatus of claim 10, wherein at least one of the sensors is a limit switch, a magnetic cylinder sensor, a photoelectric sensor, an electro-mechanical switch, or a linear variable differential transformer (LVDT).

13. The apparatus of claim 9, further comprising a flag placement module comprising one or more gas-operated mechanisms configured to place the markers of the plurality of markers between the at least two wafers.

14. The apparatus of claim 9, wherein the flag-out mechanism further comprises one or more electro-mechanical mechanisms configured to remove the markers of the plurality of markers from between the at least two wafers.

15. An apparatus, comprising:
a flag-out mechanism configured to remove a plurality of markers from an area between at least two wafers; and
at least one processor configured to calculate a velocity by which each of the markers is removed, and to generate an indicator of misalignment of the at least two wafers based on the calculated velocity, wherein the processor is configured to determine wafer misalignment based on a difference between the velocities by which each marker of the plurality of markers is removed.

16. The apparatus of claim 15, wherein the flag-out mechanism is configured to simultaneously remove the markers of the plurality of markers.

17. The apparatus of claim 15, wherein removal of the markers comprises moving the markers of the plurality of markers from a starting position to a corresponding flag-out position for each marker of the plurality of markers, and wherein the velocity by which each of the markers of the plurality of markers is removed is based on a distance between the starting position and the flag-out position for each marker of the plurality of markers, and a duration of time for each marker of the plurality of markers to reach the flag-out position.

18. The apparatus of claim 15, further comprising:
one or more of a limit switch, a magnetic cylinder sensor, a photoelectric sensor, an electro-mechanical switch, or a linear variable differential transformer (LVDT) sensor communicatively coupled with the at least one processor, the at least one processor being configured to determine the velocity by which each of the markers is removed based on feedback received from the limit switch, the magnetic cylinder sensor, the photoelectric sensor, the electro-mechanical switch, or the linear variable differential transformer (LVDT) sensor.

19. The apparatus of claim 15, wherein the processor is configured to generate a display indicating the wafers are substantially aligned based on the difference between the velocities by which the each of the markers is removed being less than a predetermined threshold.

20. The apparatus of claim 1, further comprising a suction mechanism to hold the first wafer and the second wafer after being loaded into the alignment module.

* * * * *